United States Patent
Jessie et al.

(10) Patent No.: US 7,271,465 B2
(45) Date of Patent: Sep. 18, 2007

(54) INTEGRATED CIRCUIT WITH LOW-LOSS PRIMARY CONDUCTOR STRAPPED BY LOSSY SECONDARY CONDUCTOR

(75) Inventors: Darryl Jessie, San Diego, CA (US); Charles J. Persico, Rancho Santa Fe, CA (US)

(73) Assignee: Qualcomm Inc., San Diego, CA (US)

( * ) Notice: Subject to any disclaimer, the term of this patent is extended or adjusted under 35 U.S.C. 154(b) by 451 days.

(21) Appl. No.: 10/192,476

(22) Filed: Jul. 9, 2002

(65) Prior Publication Data

US 2003/0202331 A1  Oct. 30, 2003

Related U.S. Application Data

(60) Provisional application No. 60/375,510, filed on Apr. 24, 2002.

(51) Int. Cl.
| | |
|---|---|
| H01L 29/00 | (2006.01) |
| H01L 23/48 | (2006.01) |
| H01L 23/52 | (2006.01) |
| H01L 29/40 | (2006.01) |

(52) U.S. Cl. .................. 257/531; 257/758
(58) Field of Classification Search ........ 257/530–536, 257/758; 438/618–622, 118
See application file for complete search history.

(56) References Cited

U.S. PATENT DOCUMENTS

| | | | |
|---|---|---|---|
| 6,207,553 B1* | 3/2001 | Buynoski et al. | 438/622 |
| 6,281,108 B1* | 8/2001 | Layman | 438/618 |
| 6,504,252 B2* | 1/2003 | Matsunaga | 257/758 |
| 6,710,425 B2* | 3/2004 | Bothra | 257/532 |

* cited by examiner

*Primary Examiner*—Cuong Nguyen
(74) *Attorney, Agent, or Firm*—Philip R. Wadsworth; Charles D. Brow; George C. Pappas

(57) ABSTRACT

Techniques for "strapping" a primary conductor with a secondary conductor in an integrated circuit (IC). The IC includes a number of circuit elements interconnected by a secondary conductor through a number of vias disposed at a number of locations for coupling the circuit elements as an alternative to a primary conductor. The primary conductor is typically formed with a low loss metal (e.g., copper or copper alloy), and the secondary conductor is typically formed with a lossy metal (e.g., aluminum or aluminum alloy) relative to the low loss metal. The secondary conductor is strapped to the primary conductor by the vias, which may be disposed only at both ends or along the entire length of the secondary conductor. The secondary conductor is formed using design guidelines such that it provides the required electrical connectivity when the primary conductor is not present but minimally interferes with the RF performance of the primary conductor.

21 Claims, 7 Drawing Sheets

Top View

Cross-Sectional View

Top View

Cross-Sectional View

Narrow Metal Conductor

Wide Metal Conductor

INTEGRATED CIRCUIT WITH LOW-LOSS PRIMARY CONDUCTOR STRAPPED BY LOSSY SECONDARY CONDUCTOR

RELATED APPLICATION

This application claims the benefit of provisional U.S. Application Ser. No. 60/375,510, filed Apr. 24, 2002, which is incorporated herein by reference in its entirety for all purposes.

BACKGROUND

1. Field

The present invention relates generally to integrated circuits, and more specifically to techniques for strapping a primary conductor with a secondary conductor to provide electrical connectivity as an alternative for the primary conductor.

2. Background

With modern advances in integrated circuit (IC) process technology, it is now possible to fabricate radio frequency integrated circuits (RFICs) for various applications such as wireless communication, networking, computing, and so on. These RFICs may include various analog circuit blocks (e.g., filters) that conventionally are implemented using bulky discrete components. By implementing analog circuit blocks on RFICs, various benefits may be obtained such as smaller size, lower cost, improved reliability, and so on.

The performance of analog circuit blocks (e.g., filters) fabricated on an RFIC is dependent on the electrical characteristics of the materials used to form circuit elements (e.g., inductors) that make up the circuit blocks. For example, the RF performance of inductors and transmission lines is dependent on the resistive loss of the metal conductor used to form these circuit elements. Many RFIC fabrication processes use aluminum or aluminum alloy, which is a relatively lossy material, and relatively thin thickness (e.g., 0.5–3 $\mu m$) for the metal layers. This then results in relatively high resistive loss for the metal conductor, which in turn limits the quality factor (Q) that may be achieved for inductors. Consequently, it is not possible to fabricate high-Q circuits with this lossy metal conductor.

Thick copper conductor, which is a low-loss metal, is a new development in RFIC processes. Because of its thick size (which may be 10 micrometer ($\mu m$) thick) and the higher conductivity of copper, low resistive losses can be achieved for the thick copper conductor. This then improves the RF performance of some circuit elements such as planar inductors and transmission lines. In particular, with the low resistive loss of thick copper conductor, quality factors on the order of 25 or greater may be attained for inductors at cellular and PCS frequencies. This enhanced performance is achieved without the need for expensive fabrication processing stages such as those encountered in Micro-Electro-Mechanical systems (MEMs) technologies. New possibilities in RFIC development can now be realized, such as on-chip integration of resonator tanks for voltage controlled oscillators (VCOs), high-Q passive filtering, low-loss interconnection of on-chip circuit blocks, and so on.

The fabrication process for RFICs is complicated and typically includes many processing steps. For example, circuit elements are often fabricated and interconnected with a series of wafer processing steps (e.g., etch and deposition steps). The thick copper metal, if used for the RFICs, is then formed by metal deposition, which is normally done after the wafer processing and is referred to as post-processing. For some IC fabrication processes, the wafer processing and metal deposition are performed at different facilities using different equipment.

For many IC fabrication processes, long lead times are associated with manufacturing of RFICs that use low-loss metal. The lead times may be further increased if basic testing, such as direct current (DC) testing, cannot be performed on RFICs before the low-loss metal is deposited. In particular, some circuit elements such as inductors are formed by the low-loss metal and would not be present on the RFIC until the low-loss metal has been deposited. Circuit elements relying on these inductors for interconnection would then be opened (i.e., not electrically connected) until then. It would thus not be possible to perform DC testing on these RFICs until the low-loss metal has been deposited.

The delay in the DC testing caused by the low-loss metal extends manufacturing time and further increases costs. These problems are exacerbated if the wafer fabrication and DC testing are performed in one facility and the metal deposition is performed at another facility. In this case, additional delays and costs are incurred to ship the RFICs from one facility to another, and then back to the same facility for DC testing.

There is therefore a need in the art for techniques to interconnect circuit elements in RFICs using alternative means for primary conductors that are to be formed subsequently.

SUMMARY

Techniques are provided herein to "strap" a primary conductor with a secondary conductor so that circuit elements intended to be interconnected by the primary conductor are electrically connected by the secondary conductor when the primary conductor is not present.

In a specific embodiment, an integrated circuit (IC) is provided that comprises a number of circuit elements interconnected by a secondary conductor through a number of vias disposed at a number of locations for coupling the circuit elements as an alternative to a primary conductor. The primary conductor is typically formed with a low loss metal (e.g., copper), and the secondary conductor is typically formed with a lossy metal (e.g., aluminum) relative to the low loss metal.

The secondary conductor is strapped to the primary conductor by the vias. For "parallel strapping", the vias are disposed only at both ends of the secondary conductor. For "distributed strapping", the vias are disposed along the entire length of the secondary conductor. The secondary conductor is formed such that it provides the required electrical connectivity when the primary conductor is not present but minimally interferes with the RF performance of the primary conductor. This may be achieved by: (1) locating the secondary conductor substantially underneath the primary conductor, (2) using a smaller width for the secondary conductor than that of the primary conductor, (3) minimizing the distance between the primary and secondary conductors, and (4) strapping the secondary conductor to the primary conductor along the entire length of the conductor (i.e., using distributed strapping).

The primary conductor may be used to implement various circuit elements such as inductors, transmission lines, and so on, and may further be used to provide connection for on-chip circuit elements.

In another specific embodiment, a method of fabricating an IC to facilitate testing of interconnection of circuit elements thereon prior to deposition of a top low loss metal is provided. In accordance with the method, a secondary conductor is formed over a substrate to interconnect a number of circuit elements as an alternative to a primary conductor to be formed thereon. A number of vias are also formed at a number of locations for coupling the second conductor to the primary conductor and the circuit elements.

The interconnection of the circuit elements coupled by the secondary conductor may thereafter be tested, without the primary conductor. After the testing, low loss metal may be deposited on the IC to form the primary conductor. The primary and second conductors and the vias may be formed as described above.

Various aspects and embodiments of the invention are described in further detail below. The invention further provides methods, program codes, digital signal processors, receiver units, transmitter units, terminals, base stations, systems, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
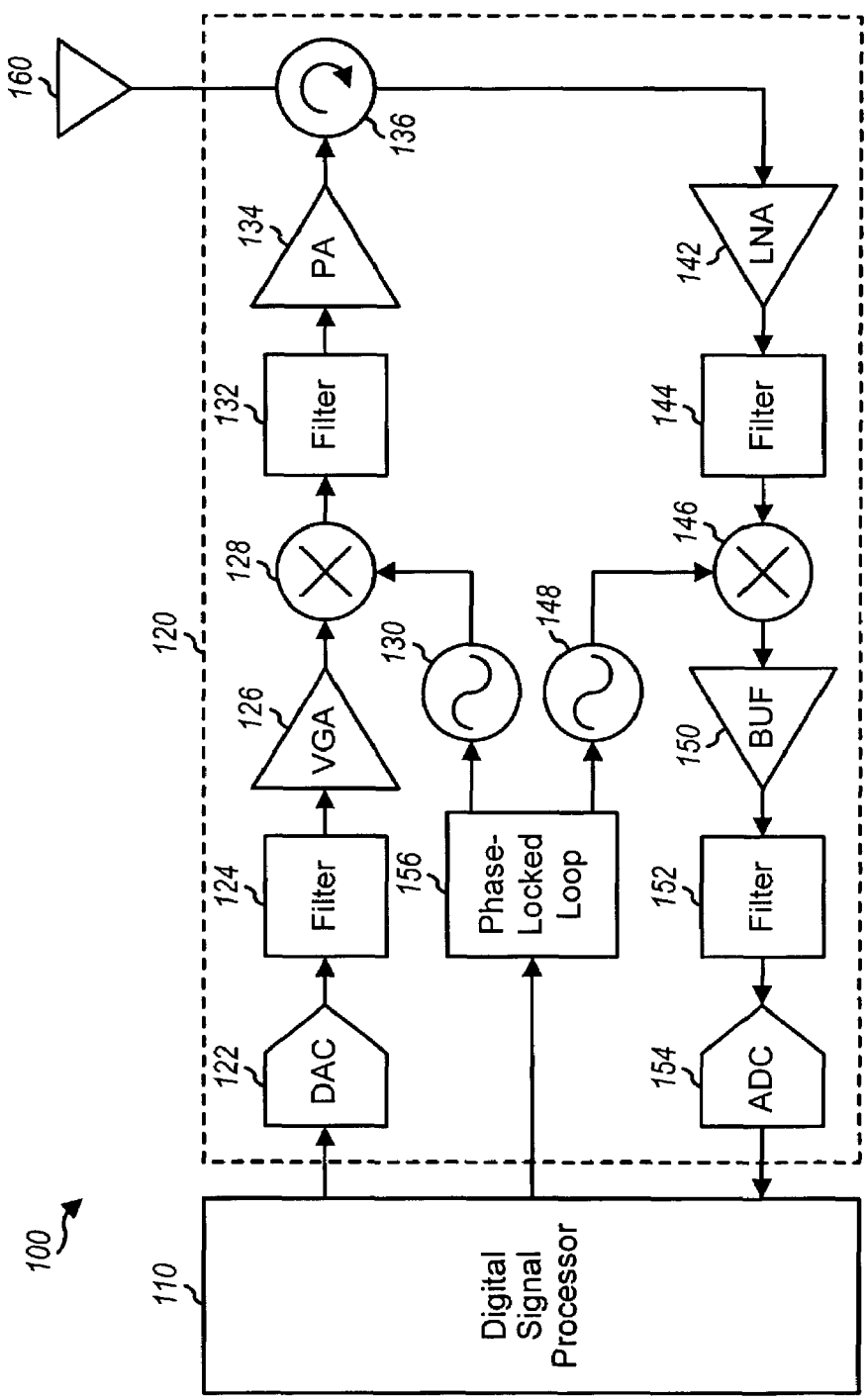
FIG. 1 is a block diagram of an embodiment of a transceiver unit that may be used for wireless communication.

FIG. 1 is a block diagram of an embodiment of a transceiver unit 100 that may be used for wireless communication. On the transmit path, digital data is provided by a digital signal processor 110 and converted to one or more analog signals by a digital-to-analog converter (DAC) 122. The analog signals are then filtered by a filter 124, amplified by a variable gain amplifier (VGA) 126, and upconverted to radio frequency (RF) by a mixer 128 based on an upconversion signal from a signal source 130. The RF signal is then filtered by a filter 132, amplified by a power amplifier (PA) 134, routed through a duplexer 136, and transmitted from an antenna 160.

On the receive path, a modulated signal is received by antenna 160, routed through duplexer 136, amplified by a low noise amplifier (LNA) 142, filtered by a filter 144, and downconverted from RF by a mixer 146 based on a downconversion signal from a signal source 148. The downconverted signal is then buffered by a buffer 150, filtered by a filter 152, and digitized by an analog-to-digital converter (ADC) 154 to provide samples. The samples are then provided to digital signal processor 110 for further processing.

A phase locked loop (PLL) 156 receives information from digital signal processor 110 and provides controls for signal sources 130 and 148 to generate the proper upconversion and downconversion signals, respectively. Signal sources 130 and 148 may each be implemented with a voltage controlled oscillator (VCO) or some other type of oscillator.

FIG. 1 shows a specific transceiver design. In a typical transceiver design, the conditioning of a signal to be transmitted and the conditioning of a received signal may be performed by one or more stages of amplifier, filter, mixer, and so on, as is known in the art. FIG. 1 only shows some of the circuit blocks that may be used to condition a transmit signal and a received signal.

Transceiver 100 may be viewed as including a digital portion and an analog portion 120, which may or may not include DAC 122 and ADC 154. The digital portion may be implemented on one or more digital integrated circuits, and the analog portion may similarly be implemented on one or more RF integrated circuits (RFICs) and/or with other discrete components.

Figure 2:
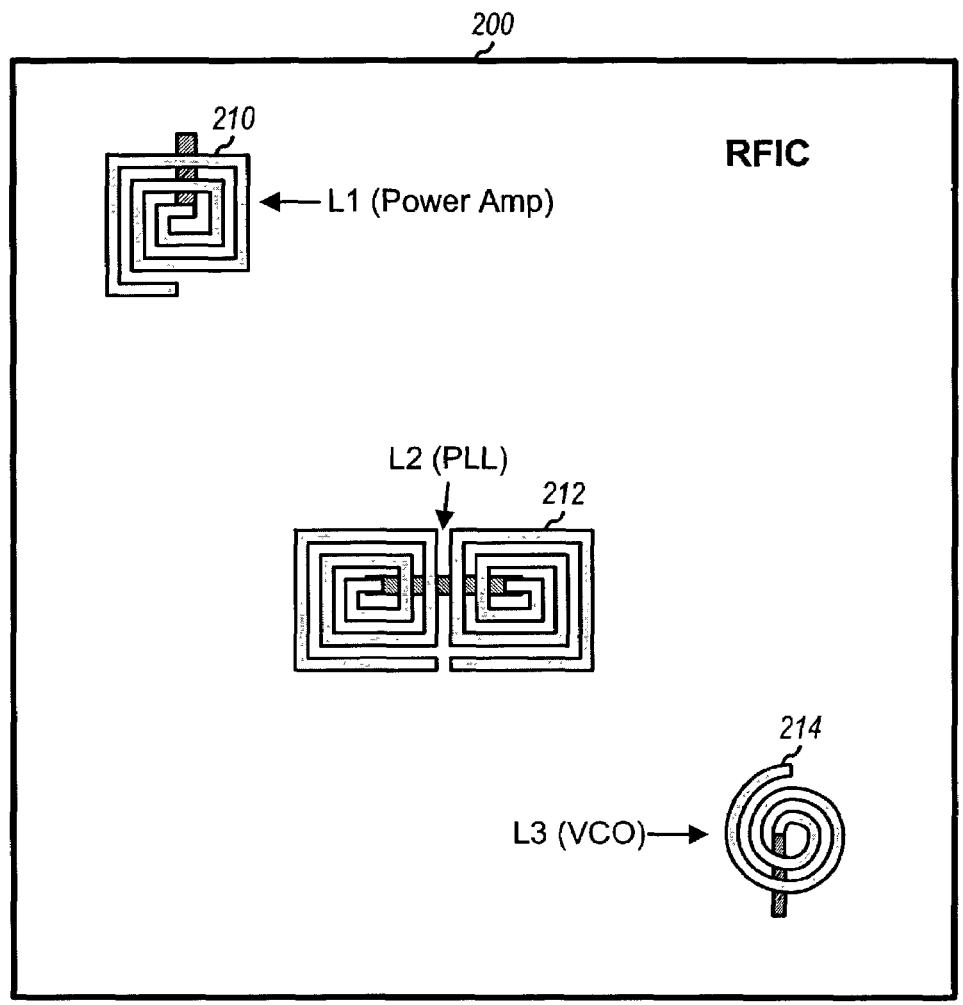
FIG. 2 is a diagram of an example RFIC layout that includes a number of inductors.

FIG. 2 is a diagram of an example RFIC layout 200 that includes a number of inductors. As shown in FIG. 1, the analog portion of a transceiver may include various circuit blocks, each of which may be implemented with a number of circuit elements (e.g., transistors, resistors, inductors, capacitors, and so on). The inductors for some of these circuit blocks may be fabricated on the RFIC. For example, inductor 210 may belong to power amplifier 134, inductor 212 may belong to phase locked loop 156, and inductor 214 may belong to a VCO for signal source 130. Other circuit elements are not shown in FIG. 2 for simplicity.

Figure 3:
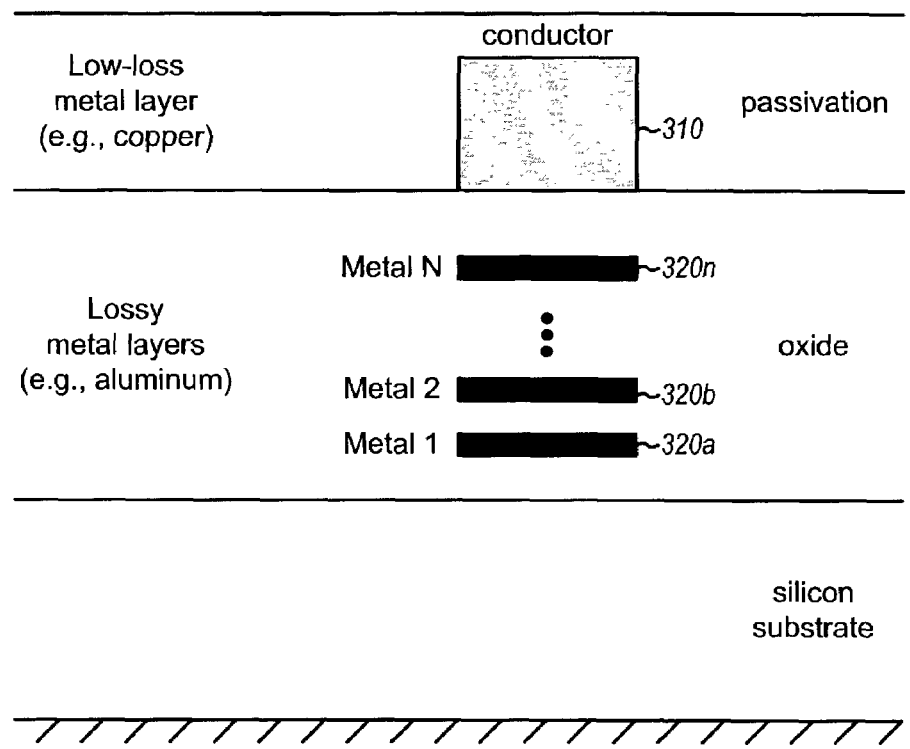
FIG. 3 shows a cross-sectional view of an RFIC with a low-loss metal layer and a number of underlayer metal layers.

FIG. 3 shows a cross-sectional view of an RFIC with a low-loss metal layer and a number of underlayer metal layers. Circuit elements such as transistors, resistors, capacitors, and so on may be fabricated in the oxide layer and the silicon wafer substrate, with the oxide layer residing on top of the silicon wafer substrate. A number of lossy metal layers 320 is available in the oxide layer and may be used to interconnect the circuit elements. The specific number of lossy metal layers (N) is dependent on the IC fabrication process employed, and may be three or some other number. Although aluminum is commonly used for the lossy metal layers, other types of metal may also be used.

As shown in FIG. 3, a low-loss metal layer 310 is fabricated on a passivation layer that resides on top of the oxide layer. As also shown in FIG. 3, the low-loss metal layer is relatively thick (at least with respect to the lossy metal layers) and may be fabricated with a high conductivity metal such as copper. The larger thickness and higher conductivity of the low-loss metal result in a low resistance conductor, which may be advantageously used to implement certain circuit elements such as inductors, transmission lines, and so on. The low-loss metal conductor may also be used to provide connection between on-chip circuit elements.

Because lossy metal layers 320a through 320n are located beneath low-loss metal layer 310, they are also referred to herein as underlayer metal layers or metal underlayers.

The steps for manufacturing an RFIC with the low-loss metal layer may proceed as follows. First, wafer fabrication is performed to provide the RFIC without the low-loss metal. Metal deposition is then performed on the RFIC to form low-loss metal conductors. Basic testing such as DC testing may thereafter be performed on the RFIC to check for electrical connectivity. If the RFIC passes the basic testing, then it is packaged and subjected to final testing.

For some RFIC processes, the wafer fabrication and basic testing are performed in one facility, the metal deposition is performed in a second facility, and the packaging and final testing are performed in a third facility. Conventionally, the steps described above are performed in sequential order because the basic testing requires the electrical connection provided by the low-loss metal conductors. In that case, the RFIC would need to be shipped from the first facility to the second facility for the metal deposition, and then back to the first facility for the basic testing. This will extend test and manufacturing time for the RFIC.

Techniques are provided herein to strap a primary conductor with a secondary conductor so that circuit elements intended to be interconnected by the primary conductor are electrically connected by the secondary conductor when the primary conductor is not present. The primary conductor may be a low-loss metal conductor with low resistive losses (e.g., copper), and the secondary conductor may be another metal conductor with higher losses (e.g., aluminum) than the low-loss metal conductor. A conductor may also be referred to as a connection, a line, a trace, or some other terminology.

The strapping secondary conductor provides electrical connectivity for circuit elements to be connected to the primary conductor, even when the primary conductor is not present (i.e., not yet fabricated). With the secondary conductor, DC testing can be performed without the need for the low-loss metal conductor, which can then shorten the wafer level testing cycle for the RFIC fabrication process described above. The secondary conductor is designed to (1) provide the required electrical connectivity, in place of the primary conductor, for circuit elements during basic testing but (2) not significantly affect the RF performance of the primary conductor, within the frequency range of interest, during normal operation of the RFIC. For example, the secondary conductor for an inductor may be designed such that inductance and phase shift (or electrical length) are minimally changed by the use of strapping.

The strapping may be achieved using various strapping schemes, which are described in further detail below. These strapping schemes may affect the RF performance of the circuit elements formed by the low-loss metal conductors in different manners, as also described below.

Low-loss metal conductors are commonly used for inductors, transmission lines, on-chip interconnection, and so on. For clarity, various aspects and embodiments are described below for the strapping of low-loss metal conductors used for inductors. Moreover, for much of the description below, copper is used for the low-loss metal conductor and aluminum is used for the lossy metal conductor used for strapping. However, other metals may also be used, and this is within the scope of the invention. For example, the low-loss metal conductor may be formed by a thick layer of aluminum. As used in the present application, "copper" refers to both copper and copper alloy, and "aluminum" refers to both aluminum and aluminum alloy.

Figure 4:
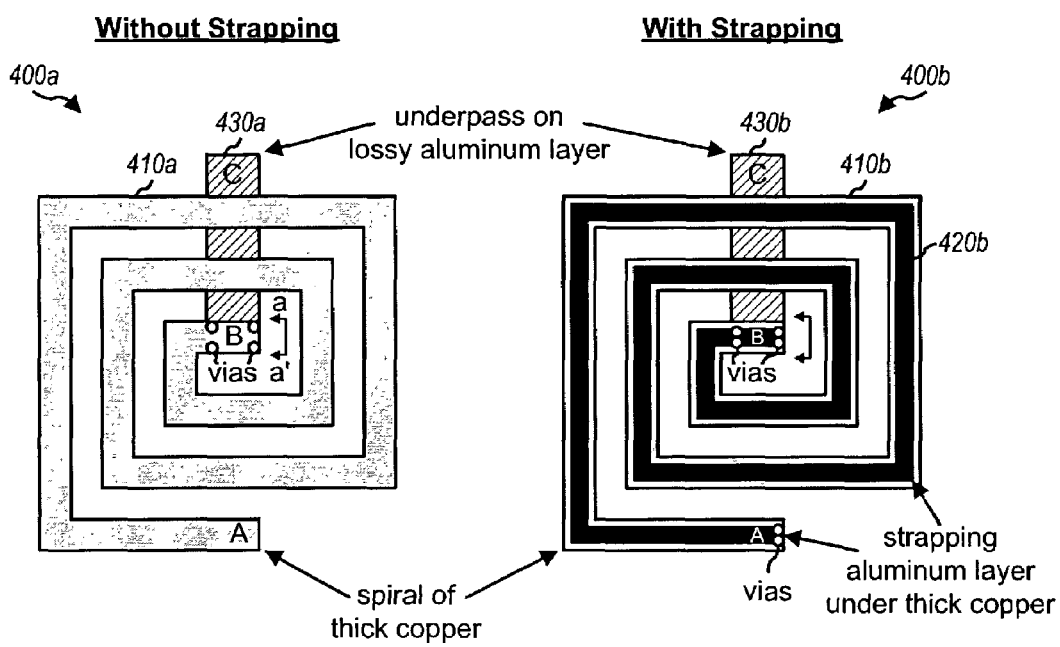
FIG. 4 is a diagram illustrating the strapping of a primary conductor with a secondary conductor for a spiral inductor.
Figure 4:
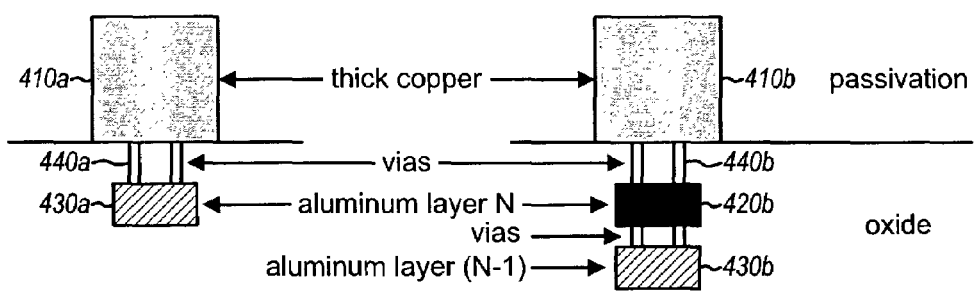

FIG. 4 is a diagram illustrating the strapping of a primary conductor with a secondary conductor for a spiral inductor. The upper half of FIG. 4 shows a top view of an inductor 400a without strapping and an inductor 400b with strapping. In the following description, the primary conductor is a copper metal conductor and the secondary conductor is an aluminum underlayer metal conductor For inductor 400a, a spiral conductor 410a of thick copper is used to form the inductor. The high conductivity of copper and the large thickness of this conductor result in an inductor having low resistive loss and high quality factor (Q), both of which are highly desirable. An underpass 430a is fabricated on a lossy aluminum layer underneath the low-loss metal and is coupled by vias to node B of the copper spiral conductor 410a. Underpass 430a effectively brings node B outside of the spiral conductor so other circuit elements can electrically couple to node B through this underpass. For inductor 400a, there is no electrical connection between nodes A and C until the copper spiral conductor 410a is fabricated. Thus, DC testing cannot be performed before the low-loss metal has been deposited on the RFIC.

For inductor 400b, a spiral conductor 410b of thick copper is also used to form the inductor. In addition, another spiral conductor 420b of lossy aluminum is formed underneath the copper spiral conductor 410b. An underpass 430b is fabricated on another lossy aluminum layer and is coupled through vias to node B of the copper and aluminum spiral conductors 410b and 420b. Again, the underpass effectively brings node B outside of these two spiral conductors so that other circuit elements can electrically couple to node B through this underpass.

A number of vias may be formed at a number of locations along the length of the aluminum spiral conductor 420b. These vias are used to electrically couple the low-loss metal spiral conductor to the aluminum spiral conductor. In one embodiment, vias are formed only at the two ends of the spiral conductors, which are nodes A and B, as shown in FIG. 4. In another embodiment, vias are formed along the entire length of the spiral conductors (e.g., evenly spaced apart by a particular distance or located intermittently between the end nodes of the conductor). In general, any number of vias may be formed so that the circuit elements coupled to node C are electrically coupled to node A even when the low-loss metal conductor is not present. In this way, DC testing may be performed before the metal deposition.

The lower half of FIG. 4 shows a cross-sectional view of inductors 400a and 400b along line a–a'. For inductor 400a without strapping, the thick copper spiral conductor 410a is fabricated on the passivation layer and underpass 430a is fabricated with an aluminum metal layer in the oxide layer. The thick copper spiral conductor 410a is coupled to underpass 430a through vias 440a at node B.

For inductor 400b with strapping, the thick copper spiral conductor 410b is also fabricated on the passivation layer, and the aluminum spiral conductor 420b is fabricated with the aluminum layer that is closest to the passivation layer (or lossy metal layer N in FIG. 3). Underpass 430b may then be fabricated with the next lower aluminum layer (or lossy metal layer N-1 in FIG. 3). The thick copper spiral conductor, aluminum spiral conductor, and underpass are all coupled together at node B through vias 440b.

FIG. 4 illustrates one type of strapping for a spiral conductor, whereby the copper conductor is strapped only at the two ends by the aluminum conductor. Various other types of strapping may also be contemplated, some of which are described in further detail below. In general, the primary conductor is strapped by the secondary conductor in a manner such that electrical connectivity is achieved to support basic testing (e.g., DC testing) while minimizing the affects on the RF performance of the primary conductor. The effects on RF performance with different types of strapping are described below.

Figure 5:
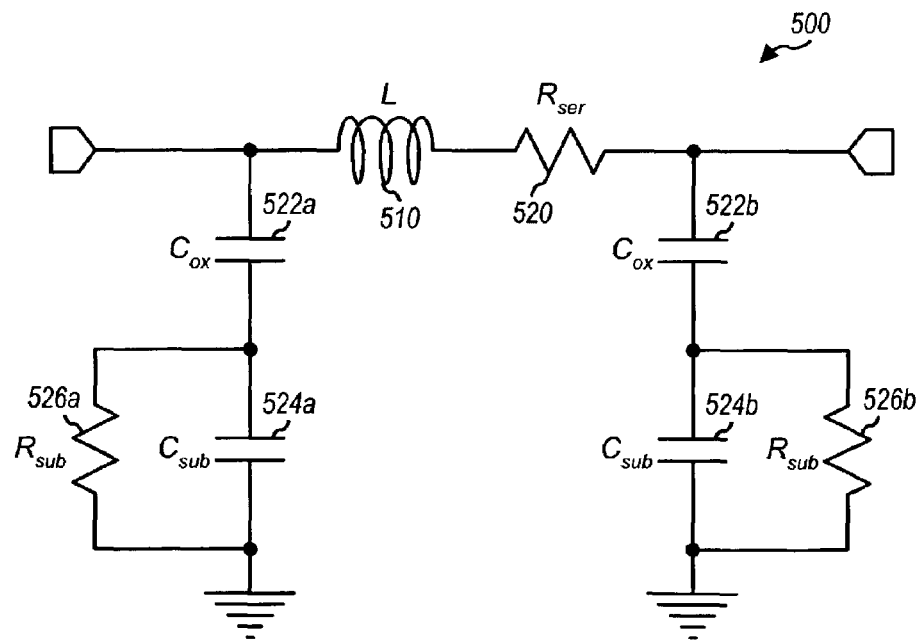
FIG. 5 is a schematic diagram of a model for a low-loss metal inductor using lumped circuit elements.

FIG. 5 is a schematic diagram of a model 500 for an inductor using lumped circuit elements. For this model, an inductor 510 represents an ideal inductor for the physical inductor, which may be formed by the low-loss metal conductor. All other circuit elements in the model represent parasitic and losses associated with the low-loss metal conductor. A series resistor 520 represents the losses of the low-loss metal conductor. Capacitors 522a and 522b represent the parasitic capacitance between the low-loss metal conductor and the oxide layer, capacitors 524a and 524b represent the parasitic capacitance between the oxide and silicon layers, and resistors 526a and 526b represent the resistance between the oxide and silicon layers.

When the low-loss metal conductor is strapped with a secondary metal conductor, the strapping secondary metal conductor affects the performance of the low-loss metal conductor in several ways. First, the strapping increases the oxide capacitance ($C_{ox}$), since the low-loss metal conductor with the strapping is effectively closer to the substrate because of the secondary metal conductor. Second, the series resistance (R) and inductance (L) of the low-loss metal conductor are also affected since the low-loss copper metal conductor is strapped in parallel by the lossy secondary metal conductor. Third, strapping has an influence on substrate resistance ($R_{sub}$) and capacitance ($C_{sub}$). However, the third effect is negligible since the wafer is relatively thick in comparison to the strapping metal width and location. The first and second effects due to strapping are described in further detail below.

Impact of Strapping on $C_{ox}$

Figure 6A:
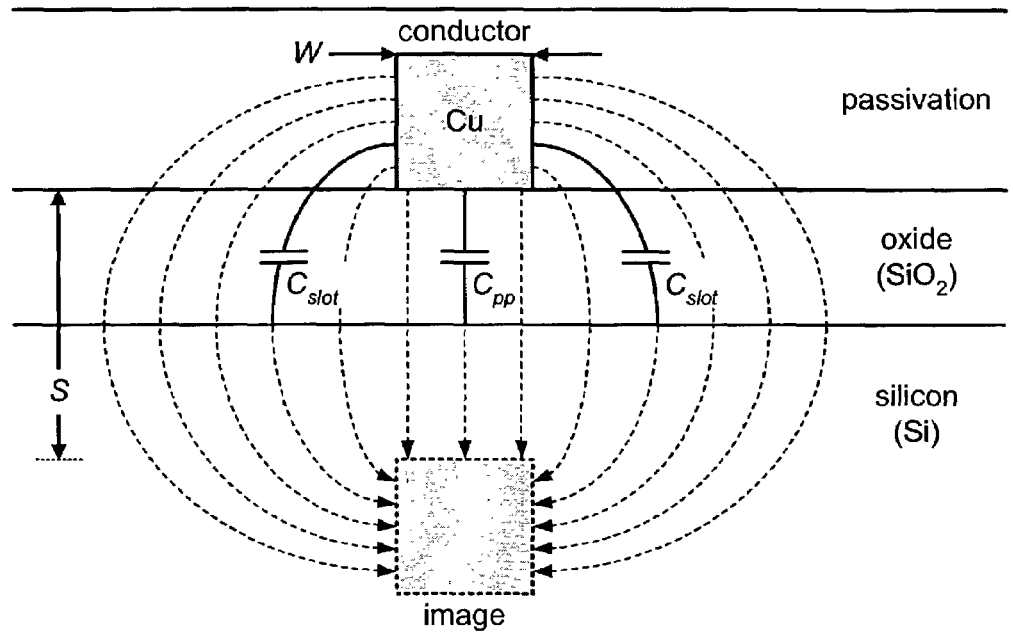
FIGS. 6A and 6B are diagrams illustrating electric field fringing effects between a conductor and its image for narrow and wide metal conductors, respectively.
Figure 6B:
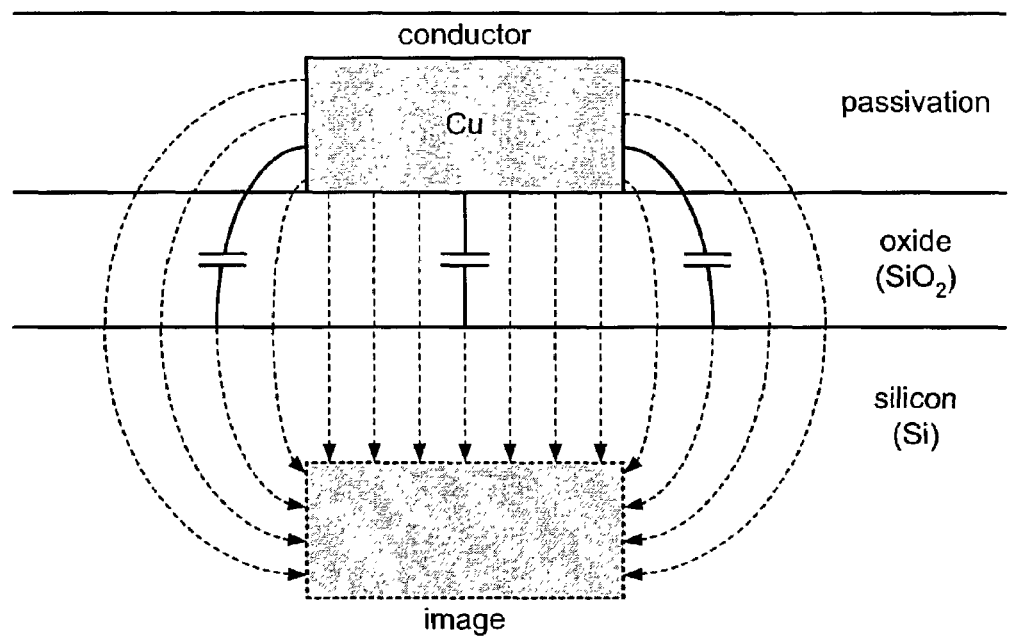

FIGS. 6A and 6B are two diagrams illustrating electric field fringing effects between a conductor and its image for a narrow metal conductor and a wide metal conductor, respectively. The oxide capacitance ($C_{ox}$) of a metal conductor may be determined based on its electric field distribution in the oxide layer. In the following derivation, it is assumed that the electric field on the conductor fringes with its image, as shown in FIGS. 6A and 6B. Moreover, the silicon layer is removed, and the oxide and passivation layer stackup is mirrored on the interface between the oxide and silicon layers.

As shown in FIG. 6A, the perpendicular electric field distribution between the conductor and its image is normal (or perpendicular) to the horizontal surfaces of the conductor and its image. A parallel plate capacitance formula may then be used to determine the capacitance ($C_{pp}$) due to these perpendicular electric fields, which may be expressed as:

$$\frac{C_{pp}}{l} = \varepsilon_r \varepsilon_o \frac{W_{low-loss}}{S}, \qquad \text{Eq (1)}$$

where l is the length of the conductor, S is the separation distance between the conductor and its image, and $\varepsilon_r$ is the relative dielectric constant for the dielectric material between the conductor and its image and $\varepsilon_o$ is the dielectric constant in a vacuum. The capacitance given in equation (1) is per unit length.

The other contribution to the total oxide capacitance is due to the electric fields fringing on the vertical surfaces of the conductor and its image. For both vertical surfaces of the conductor, the electric fields resemble that of a slot line, and the capacitance ($C_{slot}$) due to these fringing electric fields may be expressed as:

$$\frac{C_{slot}}{l} = 2 \cdot 2 \cdot \varepsilon_r \varepsilon_o \frac{K'(k)}{K(k)}, \qquad \text{Eq (2)}$$

where, $$k = \frac{S}{S+2H},$$

H is the thickness or height of the conductor, and $\varepsilon_r$ is the relative dielectric constant for the combined dielectric material for both the passivation and oxide layers. In equation (2), the first factor of 2 is for the two vertical surfaces of the conductor and the second factor of 2 is to account for the doubling of the hypothetical separation distance S. The factors K(k) and K'(k) are solutions to complete elliptical integral and its complement, respectively. Again, the capacitance given in equation (2) is per unit length. As shown in FIGS. 6A and 6B, the narrow conductor has greater capacitance contribution from fringing.

Without strapping, the total oxide capacitance ($C_{ox,no\_strap}$) for the low-loss metal conductor may be expressed as:

$$C_{ox,no\_strap} = (C_{pp} + C_{slot}), \qquad \text{Eq (3)}$$

where $C_{pp}$ is the capacitance contribution from the perpendicular electric field between the low-loss metal conductor and its image (without strapping) and $C_{slot}$ is the capacitance contribution from the fringing electric field due to the slot line effect on each vertical face of the low-loss metal conductor.

The low-loss metal conductor may be strapped with a secondary conductor formed by the top-most lossy metal layer. The width of the strapping metal conductor may be selected to be smaller than that of the low-loss metal conductor, so that the strapping only affects the perpendicular electric field between the low-loss metal conductor and its image and not the fringing electric field due to the slot line effect.

With strapping as described above, the total oxide capacitance ($C_{ox,strap}$) for the low-loss metal conductor may be written as:

$$C_{ox,strap} = C_{pp} + C_{slot} \qquad \text{Eq (4)}$$
$$= \varepsilon_r \varepsilon_o l \left[ \frac{d_{strap}(W_{low-loss} - W_{strap}) + d_{low-loss} W_{strap}}{d_{low-loss} d_{strap}} \right] + C_{slot},$$

where $W_{low-loss}$ is the width of the low-loss metal conductor and $W_{strap}$ is the width of the strapping metal conductor. The quantities $d_{low-loss}$ and $d_{strap}$ are the heights of the low-loss and strapping metal conductors, respectively, above the silicon. The above calculation in equation (4) for the oxide capacitance of the low-loss metal conductor with strapping is accurate if the width of the strapping metal conductor is equal to or smaller than that of the low-loss metal conductor (i.e., $W_{strap} \leq W_{low-loss}$) and the strapping metal conductor is located underneath the low-loss metal conductor. Otherwise, the effects of strapping on the capacitance ($C_{slot}$) due to the slot line effect would also need to be accounted for.

The oxide capacitance of the low-loss metal conductor with strapping may also be derived for other strapping schemes besides the one described above whereby the strapping metal conductor is directly underneath the low-loss metal conductor and has a smaller width. In general, different strapping schemes may affect the total oxide capacitance differently. It is generally desirable to reduce the amount of changes to the oxide capacitance due to strapping to reduce effects of strapping on the RF performance of the low-loss metal conductor.

For the low-loss metal layer, the electric field fringes through the dielectrics of the passivation layer, the silicon dioxide layer ($SiO_2$), and the silicon nitride layer (SiON). The silicon dioxide layer and the silicon nitride layer are also often referred to as the oxide layer. Some processes may include only the silicon dioxide layer and do not have the silicon nitride layer. Thus, the dielectric constants for the various layers are IC process dependent. For simplicity, a lumped value may be used for $\epsilon_r$ in equation (1) and would include the effects of the dielectrics of all three layers. For example, if the dielectric constants of the passivation, silicon dioxide, and silicon nitride layers are $\epsilon_r$=2.6, 3.9, and 4.3, respectively, then a lumped value of approximately 3.2 may be used for $\epsilon_r$ in equation (1), which is close to the weighted average of the three dielectrics.

In general, an increase in the oxide capacitance ($C_{ox}$) is undesirable for several reasons. First, it affects the self resonance frequency (SRF) of an inductor formed by the low-loss metal conductor. The lower SRF causes the inductance value to change more over frequency, as described below. Second, a higher oxide capacitance may degrade the isolation between on-chip circuit blocks. Referring back to FIG. 2, multiple inductors may be fabricated with low-loss metal conductors on an RFIC for various circuit blocks such as power amplifier, phase locked loop, voltage controlled oscillator, and so on. These inductors may be located as far away from each other as practical on the RFIC die to minimize coupling between the inductors. The strapping underlayer metal conductors for these inductors increase the oxide capacitance, which then increases coupling via the substrate and reduces isolation.

Impact of Strapping on Series L and R

A low-loss metal conductor may be strapped with a secondary metal conductor using various strapping schemes. In one strapping scheme, which is also referred to as "parallel strapping", the low-loss metal conductor is strapped by (i.e., makes contact with) the secondary conductor only at both ends of the low-loss metal conductor. In this case, the low-loss and secondary conductors are effectively in parallel. The total series inductance and resistance would then be reduced in proportion to the relative values of the series resistance and inductance of each conductor.

The total series resistance with parallel strapping may be expressed as:

$$R_{set\_tot} = \frac{R_{low-loss} R_{strap}}{R_{low-loss} + R_{strap}}, \quad \text{Eq (5)}$$

where $R_{low-loss}$ is the series resistance of the low-loss metal conductor and $R_{strap}$ is the series resistance of the secondary conductor.

Similarly, the total series inductance with parallel strapping may be expressed as:

$$L_{set\_tot} = \frac{L_{low-loss} L_{strap}}{L_{low-loss} + L_{strap}}, \quad \text{Eq (6)}$$

where $L_{low-loss}$ is the series inductance of the low-loss metal conductor and $L_{strap}$ is the series inductance of the secondary conductor.

In a second strapping scheme, which is also referred to herein as "distributed strapping", the low-loss metal conductor is strapped by the secondary conductor along the entire length of the low-loss metal conductor. In this case, the total series resistance and inductance of the low-loss metal conductor with distributed strapping may be more accurately derived by a weighted average of the effective series resistance and inductance with both conductors. The weighting function may be determined analytically or by some other means.

For both the parallel and distributed strapping schemes, the vias and the secondary conductor represent a significantly lossy path in comparison with the low-loss metal conductor. Most of the current would then flow in the low-loss metal conductor. The specific amount of current that flows in each conductor depends on the geometric sizes of the two conductors. For some RFIC processes, the underlayer metal layer used for strapping may be over ten times thinner than the low-loss metal layer and may have only half the conductivity. In addition, it is desirable to reduce the oxide capacitance by keeping the trace width of the secondary conductor narrow with respect to the trace width of the low-loss metal conductor. These factors result in the series resistance of the low-loss metal conductor being approximately two orders of magnitude smaller than that of the secondary conductor. This then results in the secondary conductor affecting the series resistance of the low-loss metal conductor by less than one percent in many cases (i.e., the series resistance of the low-loss metal conductor changes by less than one percent when strapped with the secondary conductor).

The difference in RF performance of a low-loss metal inductor between parallel strapping and distributed strapping is more pronounced when the skin effect is well developed, which is typically above 1 GHz. The currents in the conductors for the parallel strapping and distributed strapping are redistributed in different ways. This then affects the series resistance as a function of frequency. In general, it can be shown that distributed strapping may provide improved RF performance over parallel strapping.

In terms of series inductance, strapping decreases the series (self) inductance of a low-loss metal conductor, but slightly increases the mutual turn-to-turn inductance. These two effects approximately cancel each other, and the change in inductance at frequencies sufficiently below the series resonance frequency (SRF) is typically small.

Straight Transmission Line Example

Table 1 shows simulated results for a number of straight transmission lines fabricated with (1) underlayer metal only, (2) low-loss metal only, and (3) a combination of underlayer and low-loss metals. For the six designs shown in Table 1, the transmission lines all have a length of 1000 µm, the low-loss metal is copper and has a thickness of 10 µm, and the underlayer metal is aluminum and has a thickness of 0.7 µm. The widths (W) of the low-loss and underlayer conductors are shown in first column. The oxide capacitance ($C_{ox}$), inductance (L), and DC resistance ($R_{dc}$) for each transmission line design are shown in columns 2 through 4, respectively.

TABLE 1

| Transmission Line Designs | $C_{ox}$ (pF) | L (nH) | $R_{dc}$ (Ω) |
|---|---|---|---|
| Underlayer metal only (W = 6 μm) | 0.111 | 1.24 | 9.45 |
| Low-loss metal only (W = 6 μm) | 0.106 | 0.969 | 0.327 |
| Low-loss metal (W = 6 μm) Underlayer metal (W = 1 μm) | 0.116 | 0.968 | 0.325 |
| Low-loss metal (W = 6 μm) Underlayer metal (W = 2 μm) | 0.119 | 0.967 | 0.323 |
| Low-loss metal only (W = 12 μm) | 0.135 | 0.905 | 0.164 |
| Low-loss metal (W = 12 μm) Underlayer metal (W = 2 μm) | 0.145 | 0.903 | 0.163 |

It can be seen from Table 1 that the series resistance and inductance of a low-loss metal transmission line vary by less than one percent when strapped with an underlayer metal conductor with a width of one or two micron. As also shown in Table 1, the oxide capacitance increases approximately 12 percent when a 6-μm width low-loss metal transmission line is strapped with a 2-μm width underlayer metal conductor. The oxide capacitance increases approximately 7 percent when a 12-μm width low-loss metal conductor is strapped with a 2-μm width underlayer metal conductor.

Inductor Example

The performance of a low-loss metal spiral inductor with and without strapping was also simulated. For this example design, a 5 nH inductor was simulated for three different cases: (1) low-loss metal only (control), (2) low-loss metal with parallel strapping by underlayer metal, and (3) low-loss metal with distributed strapping by underlayer metal.

Figure 7A:
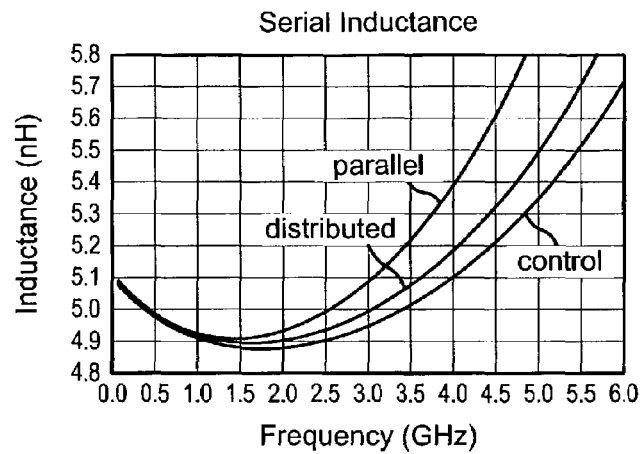
FIGS. 7A through 7C show simulated plots of the series inductance, series resistance, and quality factor, respectively, for a spiral inductor with and without strapping.
Figure 7B:
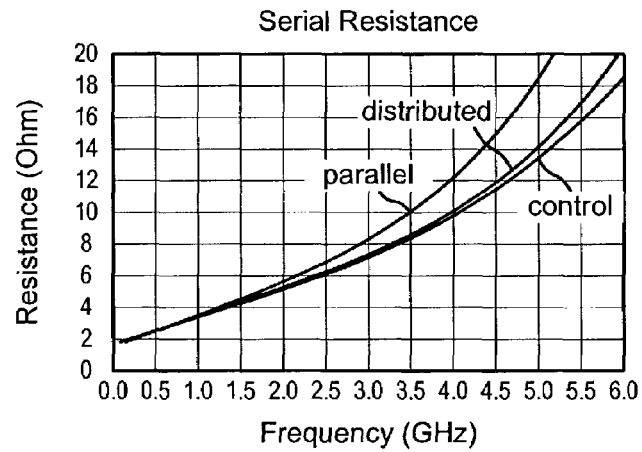
Figure 7C:
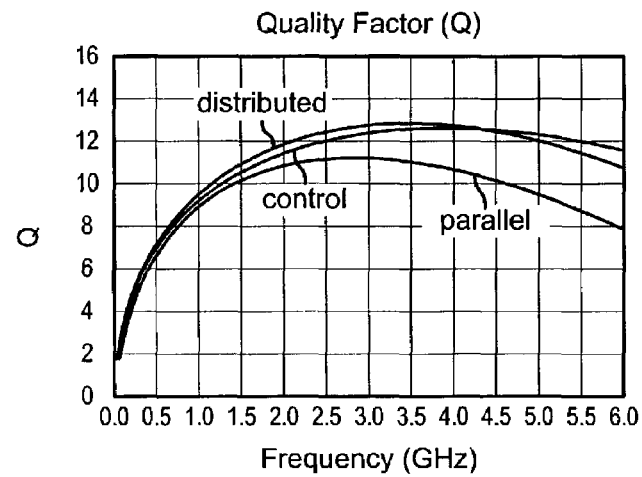

FIGS. 7A through 7C are three sets of plots of the series inductance (L), series resistance ($R_{ser}$), and quality factor (Q), respectively, for the three design cases described above. These plots show the relative changes in performance for the spiral inductor between the three design cases. It can be seen from the plots that the performance of the distributed strapping case most closely matches that of the control case (without strapping), and negligible changes in L, $R_{ser}$, and Q are seen in the plots below 3 GHz. However, the SRF drops when strapping is used, with the drop in SRF being shown by the sharp increase in inductance value at a lower frequency when strapping is used (i.e., the right side of the hyperbolic function for inductance moves toward the left). The lower SRF may have an effect on the circuit block that uses this inductor if its value is required to be within a particular range of values for a specified range of frequencies. For comparison, a spiral inductor formed with only 2-μm width underlayer metal (i.e., no low-loss metal) was also simulated and found to have an extremely large DC series resistance of 87 Ω and a series inductance of 5.65 nH.

The plots in FIGS. 7A through 7C show the effects of strapping on the RF performance of a spiral low-loss metal inductor. For this design example, distributed strapping provides better RF performance than parallel strapping. The relative change in series inductance and resistance is negligible below 3 GHz for this spiral inductor. However, the oxide capacitance increases between approximately 7 and 12 percent when a 6 or 12-μm width low-loss metal conductor is strapped with a 2-μm width underlayer metal conductor. This degrades the SRF of the inductor and the isolation between on-chip circuits.

Other Strapping Examples for Inductors

Figure 8A:
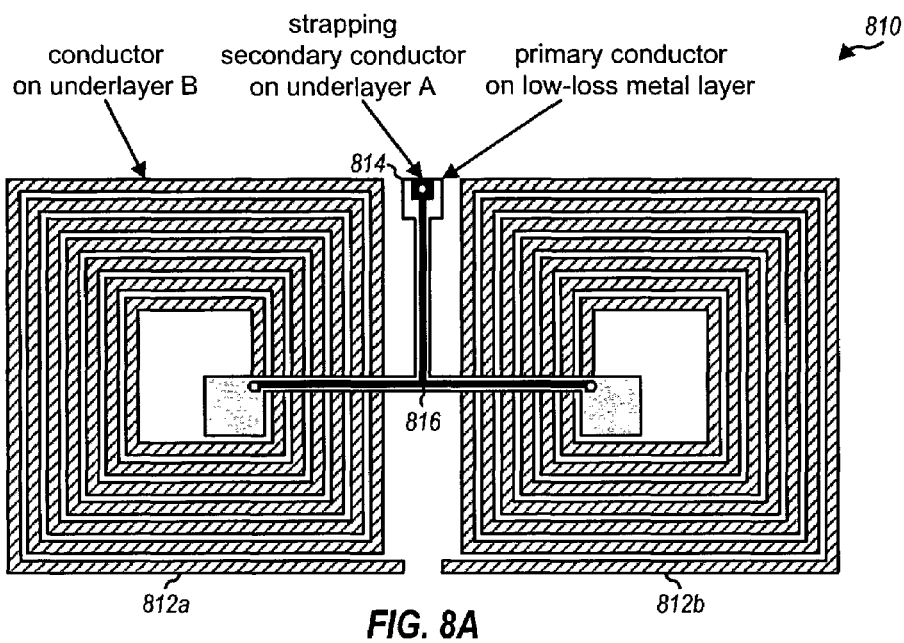
FIGS. 8A through 8C are diagrams illustrating three different inductor designs with strapping for low-loss metal conductors.
Figures 8B, 8C:
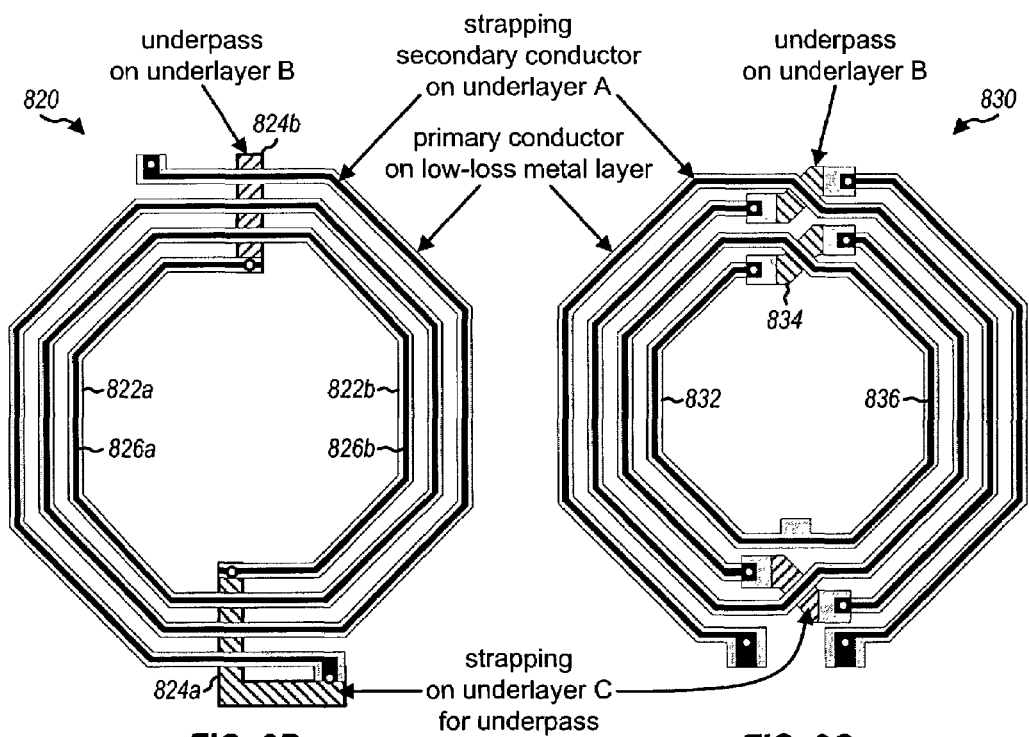

FIGS. 8A through 8C are diagrams illustrating three different inductor designs with strapping for low-loss metal conductors. For simplicity, parallel strapping is shown for these example designs.

FIG. 8A shows a differential inductor 810 comprised of two square spiral conductors 812a and 812b interconnected by a low-loss metal conductor 814 that also forms the center tap for the differential inductor. For this specific design, spiral conductors 812a and 812b are formed on an underlayer metal layer since higher loss can be tolerated for this inductor and smaller sized spiral conductors can be formed on the underlayer metal layer than on the low-loss metal layer. low-loss metal conductor 814 is strapped with a secondary conductor 816 on a different underlayer metal layer than the one used to form spiral conductors 812a and 812b.

FIG. 8B shows an inductor 820 comprised of two octagonal spiral conductors 822a and 822b interconnected at one end by an underpass 824a. Another underpass 824b is used to bring the other end of spiral conductor 822a out of the spiral so that other circuit elements can electrically couple to this end. Spiral conductors 822a and 822b are formed on the low-loss metal layer and underpasses 824a and 824b are formed on an underlayer metal layer. Secondary spiral conductor 826a and 826b are formed on another underlayer metal layer under low-loss metal conductors 822a and 822b, respectively, and are used to strap these low-loss metal conductors.

FIG. 8C shows an inductor 830 comprised of an interwoven octagonal spiral conductor 832. This inductor design is more symmetrical than the design shown in FIG. 8B. Spiral conductor 832 is formed on the low-loss metal layer and is disconnected at three locations, and three underpasses 834 are used to connect the spiral low-loss metal conductor at these locations. A secondary spiral conductor 836 is formed on another underlayer metal layer under low-loss metal conductor 832 and is used to strap the low-loss metal conductor.

Strapping Considerations

As indicated by the above design examples, the change to the oxide capacitance, series resistance, and inductance of a low-loss metal conductor due to strapping by a secondary metal conductor is dependent on various factors. These factors include: (1) the geometric sizes of the low-loss and secondary metal conductors, (2) the design and placement of the secondary metal conductor relative to the low-loss metal conductor, and (3) how the low-loss metal conductor is strapped by the secondary metal conductor.

As to the first factor, some geometric quantities of the low-loss and secondary metal conductors may be defined by the specific fabrication process used for the RFIC. For example, the thickness of the low-loss and underlayer metal conductors may be defined by the selected RFIC process. However, certain geometric quantities may be selected such as the widths of the low-loss and underlayer metal conductors. A low-loss metal conductor with a wider width may be less susceptible to changes in oxide capacitance, series resistance, and inductance due to strapping.

As to the second factor, the secondary metal conductor used for strapping may be designed and placed in numerous ways. As noted above, it is often desirable to minimize the amount of change in the oxide capacitance due to strapping. For spiral and straight conductors, this may be achieved by (1) using the top-most underlayer metal layer for the strapping conductor, so as to minimize the distance between the low-loss and strapping metal conductors, (2) placing the strapping metal conductor directly underneath the low-loss metal conductor so as to minimally affect the electric field distribution of the low-loss metal conductor, and (3) using a narrow width for the strapping metal conductor. For other types of conductor, other design guidelines may also be used to minimize the change in oxide capacitance, series resistance, and inductance of the low-loss metal conductor. However, the above represents design guidelines only. For certain designs, it may not be necessary to have the strapping metal conductor be located directly underneath the low-loss metal conductor. In general, the secondary metal conductor used for strapping may be designed and placed in numerous ways to achieve the desired results.

As to the third factor, the low-loss metal conductor may be strapped in numerous ways. As noted by the above design example for the spiral inductor, distributed strapping may provide improved RF performance for the low-loss metal conductor. However, parallel strapping requires less vias and may be desirable for some low-loss metal conductors. The strapping may also be achieved in an irregular pattern (e.g., the vias may be placed where possible on the IC).

In the above description, a low-loss metal conductor is strapped with a lossy metal conductor. The strapping may also be performed using a semi-metallic conductor or some other "exotic" conductor, and this is within the scope of the invention.

In general, the strapping of low-loss conductors on ICs is not specific to any fabrication process. Any primary conductor may be strapped with a secondary conductor for added electrical connectivity. The primary conductor typically has lower loss than that of the secondary conductor, although this is not a requirement. The secondary conductor is typically an underlayer metal conductor, although this is also not a requirement. The strapping techniques described herein may be used for any conductive metal in any configuration, with inductors and transmission lines being some common but not exhaustive examples. Moreover, the secondary conductor may be designed and placed in various manners and strapped to the primary conductor using various strapping schemes. For example, the secondary conductor is not required to follow the center of the primary conductor, although this may be the usual case. The only requirement is that the secondary conductor provides the electrical connectivity that would be provided by the primary conductor, with or without the primary conductor in place.

The strapping techniques described herein allow for efficient wafer processing and probe testing prior to subsequent processing for the low-loss metal layer. This may then reduce the overall RFIC fabrication/manufacturing time, which is highly desirable.

The strapping techniques described herein may be used for various types of ICs. For example, strapping may be used for RFICs, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and so on.

The ICs with strapping may be used for various applications, such as communication, networking, computing, and so on. For example, these ICs may be used in wireless communication systems such as CDMA systems, TDMA systems, FDMA systems, and so on.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An integrated circuit (IC) comprising:
a plurality of circuit elements; and
a secondary conductor coupling the plurality of circuit elements as an alternative to a primary conductor when the primary conductor is not present, the secondary conductor being coupled to the primary conductor through a plurality of vias disposed at a plurality of locations when the primary conductor is present, the secondary conductor being formed of a lossy metal relative to a low loss metal used for the primary conductor.

2. The IC of claim 1, wherein the primary conductor is more conductive than the secondary conductor.

3. The IC of claim 1, wherein the low loss metal is copper or copper alloy.

4. The IC of claim 1, wherein the low loss metal is aluminum or aluminum alloy.

5. The IC of claim 1, wherein the lossy metal is aluminum or aluminum alloy.

6. The IC of claim 1, wherein the plurality of vias are disposed only at both ends of the secondary conductor.

7. The IC of claim 1, wherein the plurality of vias are disposed along the entire length of the secondary conductor.

8. The IC of claim 1, wherein the secondary conductor is located substantially underneath the primary conductor.

9. The IC of claim 1, wherein the secondary conductor bass width that is smaller than the width of the primary conductor.

10. The IC of claim 1, wherein the secondary conductor has a height that is thinner than the height of the primary conductor.

11. The IC of claim 1, wherein the primary conductor is formed by a low loss metal deposition in a passivation layer that resides on top of an oxide layer where the secondary conductor is formed.

12. The IC of claim 1, wherein the secondary conductor is formed in a top-most metal layer among a plurality of metal layers.

13. An integrated circuit (IC) comprising a plurality of circuit elements interconnected by a secondary conductor through a plurality of vias disposed at a plurality of locations for coupling the plurality of circuit elements as an alternative to a primary conductor, wherein the primary conductor implements an inductor.

14. The IC of claim 1, wherein the primary conductor implements a transmission line.

15. The IC of claim 1, wherein the secondary conductor has a spiral pattern.

16. The IC of claim 1, wherein the secondary conductor is strapped to the primary conductor through the plurality of vias, and wherein the vias are located to reduce changes to RF performance of the primary conductor.

17. The IC of claim 1, wherein the secondary conductor is formed such that changes to RF performance of the primary conductor are reduced.

18. A device comprising an integrated circuit (IC) having included thereon a plurality of circuit elements; and a secondary conductor coupling the plurality of circuit elements as an alternative to a primary conductor when the primary conductor is not present, the secondary conductor being coupled to the primary conductor through a plurality of vias disposed at a plurality of locations when the primary conductor is present, the secondary conductor being formed of lossy metal relative to a low loss metal used for the primary conductor.

19. The IC of claim 13, wherein the primary conductor is more conductive than the secondary conductor.

20. The IC of claim 13, wherein the secondary conductor is located substantially underneath the primary conductor.

21. The IC of claim 13, wherein the secondary conductor has a width that is smaller than the width of the primary conductor.

* * * * *